United States Patent [19]

Greer et al.

[11] Patent Number: 4,861,425
[45] Date of Patent: Aug. 29, 1989

[54] LIFT-OFF PROCESS FOR TERMINAL METALS

[75] Inventors: Stuart E. Greer, Shelburne; Robert T. Howard, Jr., Essex Junction, both of Vt.

[73] Assignee: International Business Machines Corporation, Armonk, N.Y.

[21] Appl. No.: 234,728

[22] Filed: Aug. 22, 1988

[51] Int. Cl.$^4$ .......................... B44C 1/22; B05D 3/06; B29C 37/00; C23F 1/02
[52] U.S. Cl. ..................................... 156/644; 156/655; 156/656; 156/664; 156/668; 430/315; 430/317; 430/318; 437/203; 437/228
[58] Field of Search ............ 156/644, 655, 656, 659.1, 156/664, 668; 430/314, 315, 317, 318; 427/43.1, 97, 372.2, 374.4; 437/180, 203, 228; 357/65, 67, 69, 71; 219/121 LE, 121 LF, 121 LM

[56] References Cited

U.S. PATENT DOCUMENTS

| | | | |
|---|---|---|---|
| 4,045,594 | 8/1977 | Maddocks | 427/89 |
| 4,108,717 | 8/1978 | Widmann | 156/656 |
| 4,428,796 | 1/1984 | Milgram | 156/637 |
| 4,448,636 | 5/1984 | Baber | 156/643 |
| 4,519,872 | 5/1985 | Anderson, Jr. et al. | 156/643 |
| 4,532,002 | 7/1985 | White | 156/643 |

Primary Examiner—William A. Powell
Attorney, Agent, or Firm—Francis J. Thornton

[57] ABSTRACT

A process is described for selective removal of unwanted metallization from the surface of a semiconductor device. The process comprises the usual deposition of a configurable image defining layer on the surface of the device upon which a suitable pad limiting metallurgy (PLM) has already been deposited. The layer is then opened over the pad limiting metallurgy using standard techniques and coated with a layer of the terminal metal. The coated device is then heated to just above the melting point of the terminal metal causing the melted metal, through surface tension to form a ball of metal on the PLM and to form small globules of metal on the surface of the layer and then permitted to cool. When cooled the layer is removed using the usual techniques. Because the coating of terminal metal is no longer a continuous layer on the surface of the mask, removal of the polymer mask can be accomplished in about one-tenth of the time required when compared to a deposited terminal metal layer that is not melted. Also because of the effects of surface tension the metal coating need only be one-half the thickness required under the prior art techniques.

19 Claims, 3 Drawing Sheets

4,861,425

LIFT-OFF PROCESS FOR TERMINAL METALS

BACKGROUND OF THE INVENTION

1. Field of the Invention

This invention relates to the fabrication of semiconductor integrated circuit structures and in particular to the fabrication of the terminal metallurgy required on the surface of such semiconductor structures.

2. Description of the Prior Art

In the semiconductor art terminal metallurgy is usually produced using the so-called lift-off processes, wherein a uniform layer of the terminal metal is laid down over the entire surface of the chip which is coated by a soluble polymer in those places the metal is not to contact the surface of the chip so that by the dissolution of the polymer the metal in the unwanted areas is lifted off the surface of the chip.

Typical lift-off processes are shown in a number of prior art patents, such as for example, U.S. Pat. Nos. 4,532,002; 4,108,717 and 4,045,594. In these processes metal deposited on the surface of a semiconductor device is lifted off by a dissolving of the underlying organic material.

An improvement to the basic lift-off concept was described in U.S. Pat. No. 4,519,872 which sets forth a lift-off process in which the underlying polymer is thermally depolymerized such that its dissolution can be more quickly accomplished since depolymerized polymer is more easily removed in a solvent.

Another improved lift-off process is described in U.S. Pat. No. 4,428,796 in which the polymer is heated to break the bond between deposited metal and the polymer.

Still another improved lift-off process is in U.S. Pat. No. 4,448,636 which describes a process in which the underlying polymer is heated with radiant energy, such as from a laser, to cause the polymer, under the metal film, to outgass thereby breaking the mechanical bond between the metal film and the resist.

SUMMARY OF THE INVENTION

The present invention provides an improved method for the formation and fabrication of terminal metallurgy of integrated circuits. The present invention can utilize various image defining layers, such as polymers or photoresist compositions which do not polymerize significantly at higher temperatures. The present invention also permits reduction in the thickness of the deposited terminal metal layers while still maintaining the thickness of the final metallurgy on the chip. Still further, the process of the present invention permits the removal of the unrequired excess deposited metal from the surface of the underlying insulating image defining layer without removing of the image defining layer, thus providing greater physical protection as well as alpha barrier protection to the underlying wafer and still achieve the necessary exterior, external terminal electrical connections required to properly connect and drive the circuit.

A process is described for selective removal of unwanted metallization from the surface of a semiconductor device. The process comprises the usual deposition of a configurable image defining layer or mask on the surface of the device upon which a suitable metallurgy, such as pad limiting metallurgy (PLM) has already been deposited. The image defining layer is then opened over the metallurgy using standard techniques and coated with a layer of the terminal metal. The coated device is then heated to just above the melting point of the layer of terminal metal on the metallurgy causing the melted metal, through surface tension to form a ball of terminal metal on the metallurgy and to form small globules of metal on the surface of the image defining layer or mask and then permitted to cool. When cooled the image defining layer or mask is removed using the usual procedures. Because the coating of terminal metal is no longer a continuous layer on the surface of the mask, removal of polymer masks can be accomplished in about one-tenth of the time required when compared to a deposited terminal metal layer that is not melted. Also because of the effects of surface tension the terminal metal coating need only be one-half the thickness required under the prior art techniques.

DESCRIPTION OF THE PREFERRED EMBODIMENTS

The present invention is particularly used for forming the terminal metallurgy, i.e. contacts and metallic wiring, on the surface of a semiconductor device and will be described in reference to formation of the final solder contacts found on semiconductor devices.

Figure 1:
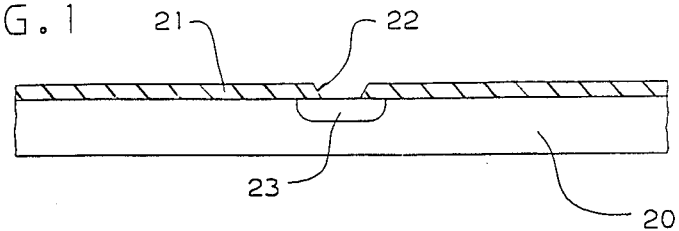
FIGS. 1 through 7 show, in section, one sequence of a process embodying the present invention.
Figure 2:
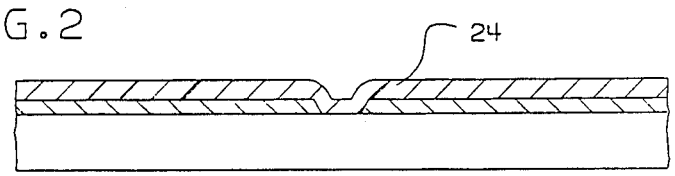
Figure 3:
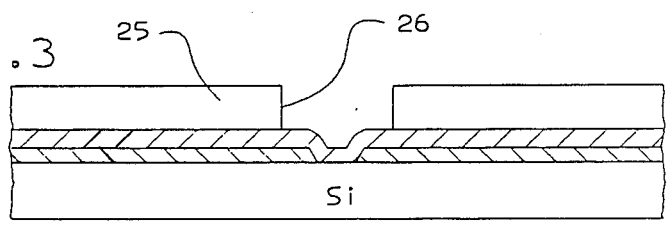
Figure 4:
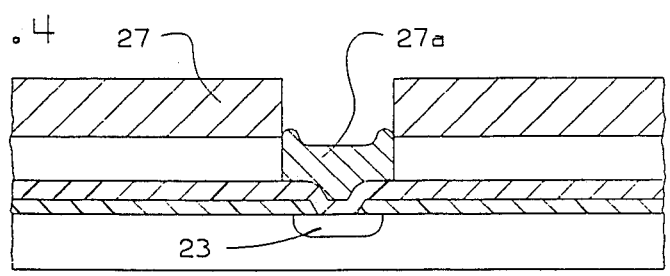
Figure 5:
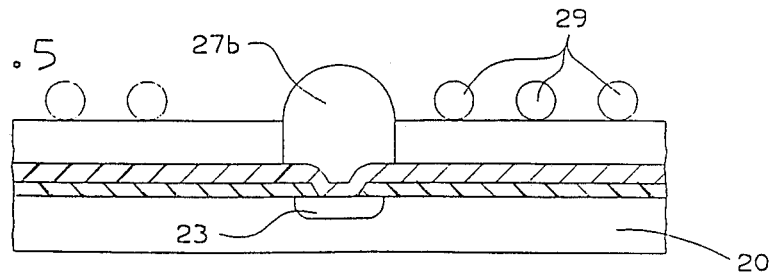

FIG. 1, shows in section, a portion of a typical semiconductor wafer 20 in which there is provided a number of semiconductor circuits 23 and which has completed all the processing prior to final metallization. This FIG. 1 shows the wafer 20 provided with a suitable insulating layer such as a polyimide layer 21, which, in turn, is provided through known techniques such as photolithographic and etching techniques with a suitable via opening 22 leading to the underlying semiconductor circuit 23. It should be noted that such circuits usually require a multiplicity of such openings in which contacts can be made but, for the sake of illustration only, only the formation of one such contact will be shown. It should also be noted that many insulating materials can be used for this layer and many techniques such as a laser beam cutting of the like could be used to make the required openings therein. Following the formation of this opening 22, a layer 24 of so-called pad limiting metallurgy (PLM) usually a micron or so thick, such as chrome-copper-gold or chrome-copper-chrome, or titanium, or titanium-copper as shown in FIG. 2, is deposited, for example by evaporation or sputtering, over the polyimide and through the opening 22 to contact the underlying semiconductor circuit 23. After this PLM is deposited, as shown in FIG. 3, a suitable image defining layer 25 which may be, for example a photoresist sold commercially under the name of Dupont 2560 or Dupont Riston is applied in a thickness of between 38–100 microns (1.5 to 4 mils). The use of such photoresist for such a purpose is well known to the semiconductor industry. It should be noted that other materials can be used for this purpose such as polyimide, glass, etc. The photoresist is exposed and developed using normal photolithographic procedures, as is well known to those skilled in the art, to create a window 26 overlying the PLM coated via opening 22 provided in the polyimide layer 21. This window 26 is carefully dimensioned to define the contact area of the final deposits of terminal contact material to the PLM. As shown in FIG. 4, following the opening of this window 26 in the photoresist a 125 to 150 micron thick lead-tin deposit 27 is made over the entire surface of the photoresist layer 25 by any suitable deposition technique, such as for example, evaporation. This deposit 27 also forms on the surface of the PLM 24 exposed through the window 26. The lead-tin deposit in the region of the window 26 is less then the thickness of the photoresist layer 25 and is thus shown as the depressed layer 27a. Following this lead-tin evaporation and deposit of layers 27 the coated semiconductor wafer 20 is heated in any suitable manner, which can be for example a suitable oven or other heated chamber (not shown), to a temperature of approximately 360° C. which is above the melting temperature of the lead-tin deposit, but below the degradation temperature, i.e. that the temperature below which adverse affects such as oxidation, depolymerization or other significant changes in the material characteristics occur of the polyimide 21 or the photoresist layer 24. It should be noted that such heating of the device must be above the melting point of the metal but below that temperature which will adversely affect the semiconductor circuit 23 or any of the previously deposited materials. Preferably this melting is, in this instance, achieved by heating the coated device in a furnace containing a hydrogen atmosphere at 360°. Because of the confining walls of the photoresist 25 around the opening 26 the lead-tin deposit upon melting forms a terminal solder ball 27b in the opening 26 which upon cooling is fixedly adhered to the underlying PLM layer 24. It should be noted that solder ball 27b has considerably more mass than the deposited layer 27a. This is due to the flowing of the melted material and surface tension in the melted material which causes the ball 27b to pull additional material from the surface of the photoresist. That material which is not attracted into the opening 26 by virtue of surface tension of the ball 27 is caused by the same surface tension to be gathered into a plurality of small globules 29 as shown in FIG. 5.

It should be noted that such heating can be localized on a particular portion of the deposited lead-tin layer by, for example uses a laser or a micro-flame apparatus. Again, the temperature of any of the underlying layers must not be caused to reach the degradation temperature. Still further it should be noted that materials other than lead-tin combinations can be used. The sole requirement being that the melting temperature of the selected material being below that of either the polymerization or degradation temperature of the underlying layers.

Figure 6:
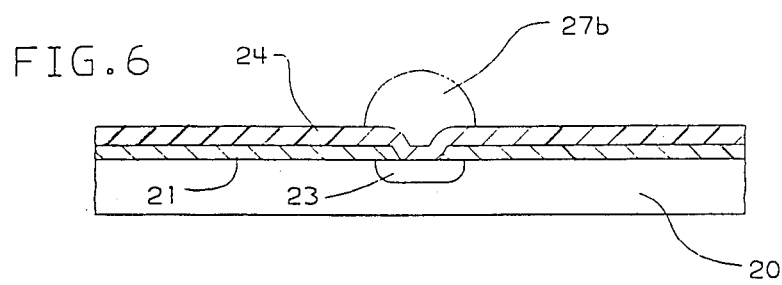
Figure 7:
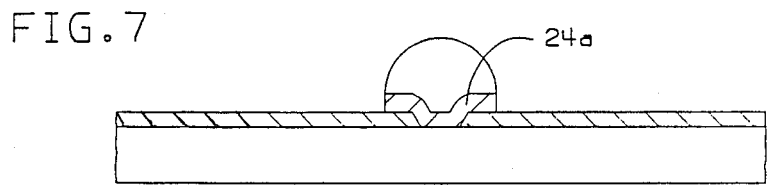

Since surface tension causes the lead-tin in the opening 25 to be built-up into heights well above the photoresist thickness the need for thick initial accumulations is eliminated and the initial deposit need only be about one-half that of required by prior art techniques. Because the lead-tin deposit on the surface of layer 25, due to surface tension, forms globules 29 on the surface of the photoresist layer 25, extensive portions of the surface of layer 25 are exposed making it more available for rapid chemical stripping. Since the photoresist layer 25 has not been altered by the heating action it can be readily stripped, using a standard photoresist stripper within a period of between 1 and 4 minutes. Such stripping of the photoresist layer also removes the globules of solder 29 accumulated on the surface while leaving untouched the solder ball 27b, as shown in FIG. 6. After the removal of the photoresist layer 25 the PLM layer 24 of chrome-copper-gold is exposed everywhere except under ball 27b, as shown in FIG. 6. This undesired and now exposed portion of PLM layer 24 can be removed from the surface of the polyimide layer 21 by a standard etch procedure using either potassium cyanide, gold, ammonium hydrosulfate or ammonium hydroxide plus water for the copper or potassium permanganate for the chrome.

This results in a single solder ball mounted on a remaining portion 24a of the PLM layer 24 which extends through the opening 22 in the polyimide layer 21. The solder ball is now suitable for connection to an external circuit, such as a printed circuit board by conventional means.

Tests performed on such devices using the above described process have found that by slightly tilting the semiconductor wafer at an angle, of about 20° or more, from the horizontal during heating will cause the excess melted solder, to run off the surface of the device leaving only the material contained within the opening 26 in the photoresist. Thus, globules 29 run off the surface of the photoresist. Such globules can also be forced off the surface by using air jets or other such techniques.

Figure 8:
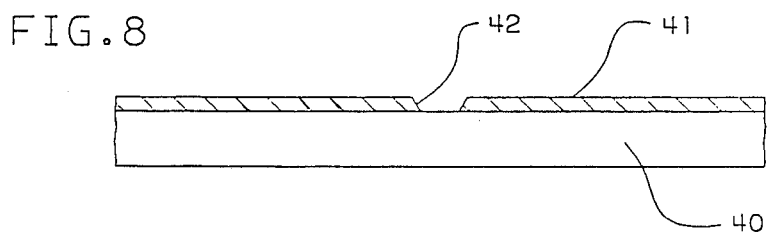
FIGS. 8 through 13 show a sequence of a different but preferred process embodying the invention.
Figure 9:
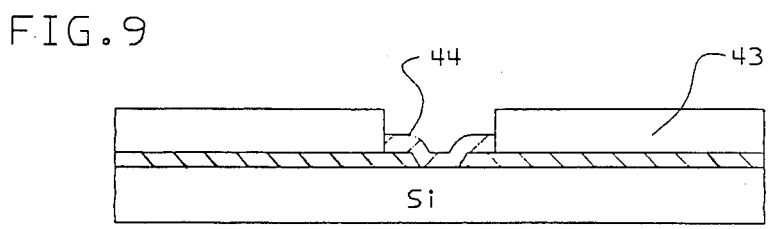
Figure 10:
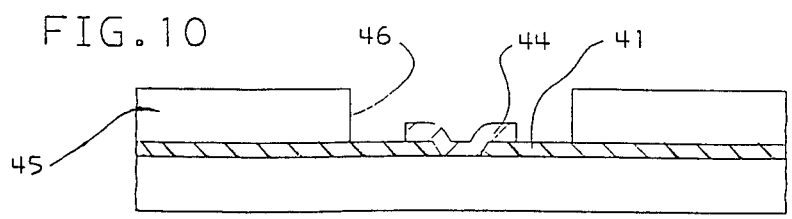

Turning now to FIGS. 8 through 13, there is described the embodiment preferred by the inventors and which is a variation in the process described in FIGS. 1 through 7. FIG. 8 shows a silicon semiconductor wafer 40 having a polyimide layer 41 deposited thereon in which an opening 42 has been previously opened through photolithographic techniques. Following this as shown in FIG. 9 a suitable image defining mask 43 such as photoresist or molybdenum is disposed as previously described over the polyimide 21 so that all of the layer 41 except for a defined region around opening 42 is covered. A pad limiting metallurgy or PLM deposit 44 is now laid down over and around the opening 42 using standard deposition techniques. Subsequently, the mask 43 is removed using standard etching procedures or other removal techniques suitable for the mask used, and as shown in FIG. 10, using standard techniques, a layer of photoresist 45 is laid down on the surface of layer 41. This layer 45 is provided with an opening 46 which is larger than that of the pad limiting metallurgy deposit 44 placed in and around the opening 22 and exposes a ring 47 of the polyimide surface around the PLM deposit 44. This means that photoresist masks need be less restrictive as to matching up to the dimensional aspects of the pad limiting metallurgy. Thus, looser groundrules, i. e. dimensional differences, are permitted to be used with this process as compared to the process described in conjunction with FIGS. 1 to 7 and which taught that the photoresist covered a portion of the pad limiting metallurgy.

Figure 11:
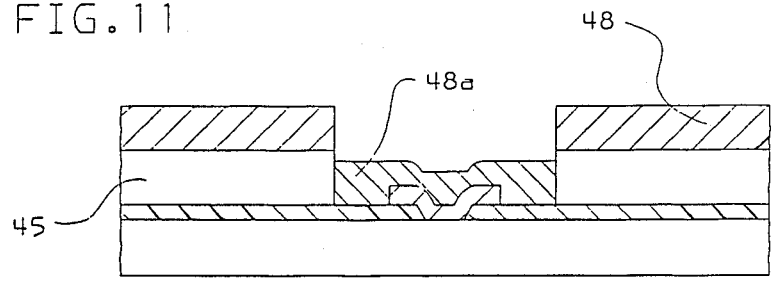
Figure 12:
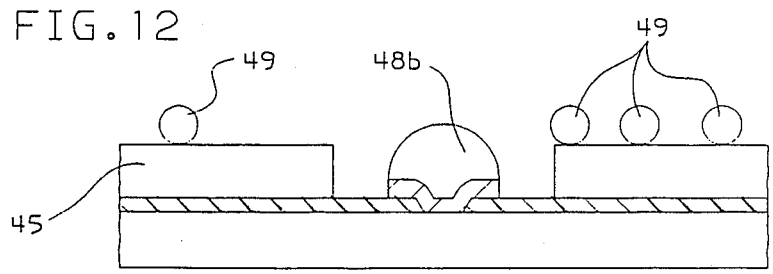
Figure 13:
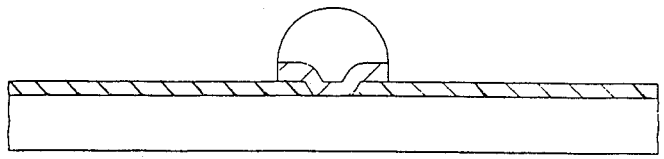

Following the deposit of the photoresist layer 45 a layer 48 of lead-tin is deposited, by any convenient technique, over the photoresist 45 and the opening 46 as shown in FIG. 11. Following the deposit of the lead-tin layer 48 the coated wafer 40 is heated to melt the layer 48. This melting of layer 48 is accomplished in the manner described in conjunction with FIGS. 1 to 7 and forms a ball of solder 48b over the PLM 44. Due to the surface tension of the melted lead-tin layer the portion 48a, deposited in opening 46, contracts from the exposed surface of the polyimide ring 47 around the PLM 44 and collates into a hemispherical ball 48b positioned exactly over and on the PLM 44. Thus no excess lead-tin remains on the exposed polyimide surface 47 within the confines of the photoresist defined opening 46. The remaining deposit of lead-tin on the surface of the photoresist layer 45 is formed by this heating step into globules 49.

Following this heating and balling of the deposited lead-tin layer 48 the photoresist material 45 can be removed by immersing the unit into a standard photoresist removal bath. At that point the device is completed and no further processing is required.

It should be understood that, at times, it may not be necessary to remove the masking material after the heating of the unit especially when the unit is heated in such a way that all the excess metal is caused to run off the surface of the masking material during the heating step.

Thus, there has been described two different processes utilizing image defining masks which are not significantly affected at the temperatures required to melt the lead-tin deposit. Photoresist materials suitable for such a purpose include dry film, such as Dupont Vacrel, Dynachem or liquids such as Ciba-Geigy #348. All of these are particularly useful being suitable for image creation of photolithographic images therein.

The processes described herein permits reduction in the evaporation time by permitting thinner lead-tin alloy deposits and provides for significant surface clearance of the photoresist layer in a brief period while retaining the required terminal pads, thus permitting the stripping of the photoresist to occur in a significantly shorter period of time, i.e., 1 to 4 min., versus approximately 30 min. or more using the prior art techniques.

It should be noted that the resist utilized can be water soluble, halogenated or other types of solvents can be used and which were not usable by the prior art processes.

It should be especially noted that this process can be adapted to produced lines as well as individual pads and that while the invention herein is described with references to the preferred embodiments of the invention it should be understood that numerous variations may be made in these processes without departing from the scope of the invention as defined in the appended claims.

I claim:

1. A lift-off process for removing a metallic layer deposited over a layer of masking material deposited on a semiconductor device comprising the steps of:
   depositing a layer of masking material on the surface of the semiconductor device,
   creating an opening in the layer of masking material, and
   depositing a layer of metal over said layer of masking material and in said opening,
   heating said metal layer to cause melting of said metal layer in said opening, removing said metal outside of said opening.

2. The process of claim 1 wherein the masking material is a photoresist.

3. The process of claim 2 wherein the opening in the masking material is created by a photolithographic process.

4. The process of claim 2 wherein said layer of metal has a melting point below the degradation temperature of the photoresist.

5. The process of claim 4 wherein said heating is achieved by using a heated chamber.

6. The process of claim 4 wherein said heating is achieved by using a laser beam.

7. A lift-off process for removing a metallic layer deposited over a layer of masking material deposited on a semiconductor device comprising the steps of:
   creating a layer of insulating material on a selected surface of the device,
   forming openings in selected regions of said insulating layer,
   depositing a first metallic layer in said opening,
   depositing a layer of masking material on the surface of the layer of insulating material,
   creating a plurality of openings in the layer of masking material, and
   depositing a second metallic layer over said layer of masking material and in said openings,
   characterized by heating said second metallic layer to cause melting of said second metallic layer, and
   removing said layer of masking material.

8. The process of claim 7 wherein said insulating layer and said layer of masking material are different polymers.

9. The process of claim 8 wherein said openings in said insulating layer and said layer of masking material are formed photolithographically.

10. The process of claim 9 wherein said first metallic layer is comprised of chrome-copper-gold or chrome-copper-chrome.

11. The process of claim 10 wherein said second metal layer is comprised of lead and tin.

12. The process of claim 10 wherein said second metallic layer has a melting point below the melting point of the first metallic layer and below the degradation temperature of the polymers.

13. The process of claim 12 wherein said layer of masking material is removed from the layer of insulating material by a chemical stripping action.

14. The process of claim 10 wherein said semiconductor device is positioned at an angle of more than twenty degrees to the horizontal while said second metallic layer is being heated.

15. The process of claim 14 wherein said device is heated in a chamber to a temperature of between 300° C. and 450° C.

16. The process of claim 10 wherein said second metallic layer is heated with a laser.

17. The process of claim 7 wherein said insulating layer is composed of a glass.

18. The process of claim 7 wherein said second metallic layer is approximately one-half the thickness of said layer of masking material.

19. A lift-off process for removing a metallic layer deposited over a photoresist layer deposited on a semiconductor device comprising the steps of:
   creating a layer of insulating material on a surface of the device,
   forming openings in selected regions of said insulating layer,
   depositing a first metallic layer in said openings,
   depositing a layer of photoresist, having a polymerization temperature and a depolymerization temperature, on the surface of said insulating layer,
   photolithographically creating a plurality of openings in the photoresist layer, over selected regions of said first deposited metallic layer,
   depositing a second metallic layer over said photoresist layer and in said openings in said photoresist layer, said second layer having a melting point less than the melting point of said first metallic layer and less than the polymerization temperature and the depolymerization temperature of the photoresist, heating said second metal layer to cause melting of said second metal layer, and removing said photoresist from the surface of said insulating layer by using a chemical stripping agent.

* * * * *